United States Patent
Lin et al.

(10) Patent No.: US 10,104,817 B1
(45) Date of Patent: Oct. 16, 2018

(54) ELECTROMAGNETIC-INTERFERENCE SHIELDING DEVICE AND METHOD FOR MANUFACTURING THE SAME

(71) Applicant: KINSUS INTERCONNECT TECHNOLOGY CORP., Taoyuan (TW)

(72) Inventors: Ting-Hao Lin, Taoyuan (TW); Chiao-Cheng Chang, Taoyuan (TW); Yung-Lin Chia, Taoyuan (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 15/859,982

(22) Filed: Jan. 2, 2018

Related U.S. Application Data

(63) Continuation of application No. 15/488,133, filed on Apr. 14, 2017, now Pat. No. 9,901,016.

(51) Int. Cl.
   *H05K 9/00* (2006.01)

(52) U.S. Cl.
   CPC .......... *H05K 9/0024* (2013.01); *H05K 9/003* (2013.01); *H05K 9/0037* (2013.01); *H05K 9/0088* (2013.01); *H05K 9/0092* (2013.01)

(58) Field of Classification Search
   CPC ..... H05K 9/0007; H05K 9/003; H05K 9/0088
   See application file for complete search history.

(56) References Cited

U.S. PATENT DOCUMENTS

| | | | | |
|---|---|---|---|---|
| 5,461,545 A | * | 10/1995 | Leroy | H05K 3/284 174/17.05 |
| 5,981,043 A | * | 11/1999 | Murakami | H05K 1/095 174/257 |
| 6,218,610 B1 | * | 4/2001 | Suzuki | H01L 23/552 174/377 |
| 6,683,245 B1 | * | 1/2004 | Ogawa | H05K 9/0037 174/382 |
| 7,446,265 B2 | * | 11/2008 | Krohto | H05K 9/003 174/369 |
| 8,008,753 B1 | * | 8/2011 | Bolognia | H01L 23/552 257/659 |
| 8,093,691 B1 | * | 1/2012 | Fuentes | H01L 23/3128 257/659 |
| 9,179,538 B2 | * | 11/2015 | Foster | H05K 1/0218 |
| 2001/0054754 A1 | * | 12/2001 | Inoue | H01L 23/3135 257/676 |

(Continued)

*Primary Examiner* — Hung V Ngo
(74) *Attorney, Agent, or Firm* — Innovation Capital Law Group, LLP; Vic Lin

(57) ABSTRACT

An EMI shielding device is provided. A first shielding layer is formed on a first surface of a first substrate, and a first through hole is formed through the first substrate. A second substrate is mounted in an opening of the first through hole, and a second shielding layer is formed on a surface of the second substrate. A conductive paste is mounted between the first substrate and the at least one second substrate to electrically connected the first shielding layer and the second shielding layer. The EMI shielding device is adopted to be mounted on a printed circuit board (PCB) by Surface Mount Technology. Therefore, the EMI shielding device may be firmly mounted on the PCB, and there is not any narrow gap that may leak electromagnetic radiation.

11 Claims, 10 Drawing Sheets

(56) References Cited

U.S. PATENT DOCUMENTS

| | | | | |
|---|---|---|---|---|
| 2006/0152913 A1* | 7/2006 | Richey | ................ | H05K 1/0218 |
| | | | | 361/818 |
| 2009/0289755 A1* | 11/2009 | Yu | ........................... | H01F 27/36 |
| | | | | 336/84 R |
| 2012/0243199 A1* | 9/2012 | Wu | ...................... | H01L 23/552 |
| | | | | 361/818 |
| 2012/0261181 A1* | 10/2012 | Izawa | .................. | H05K 9/0024 |
| | | | | 174/378 |
| 2015/0215994 A1* | 7/2015 | Bohlender | ............... | H05B 3/24 |
| | | | | 219/540 |

\* cited by examiner

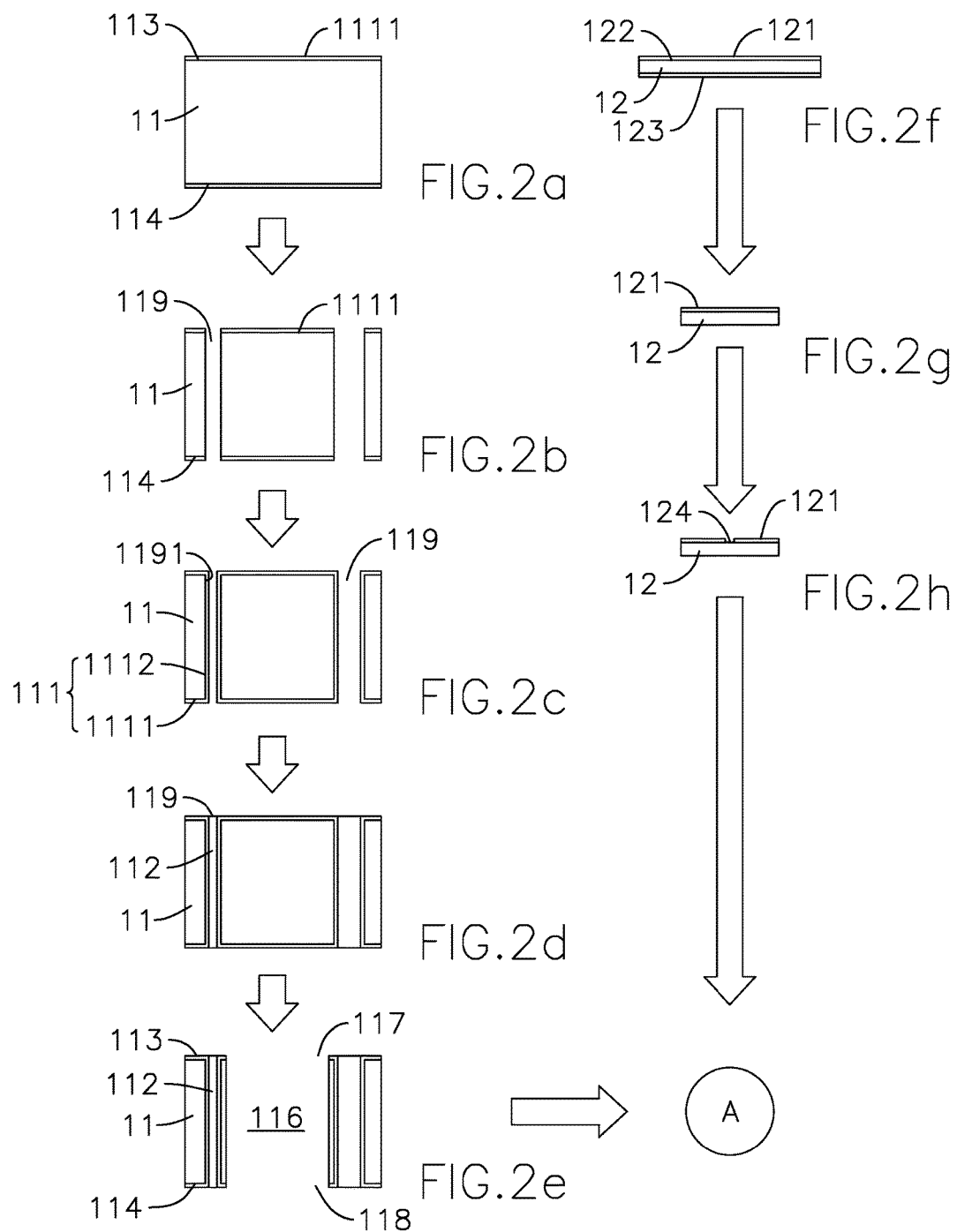

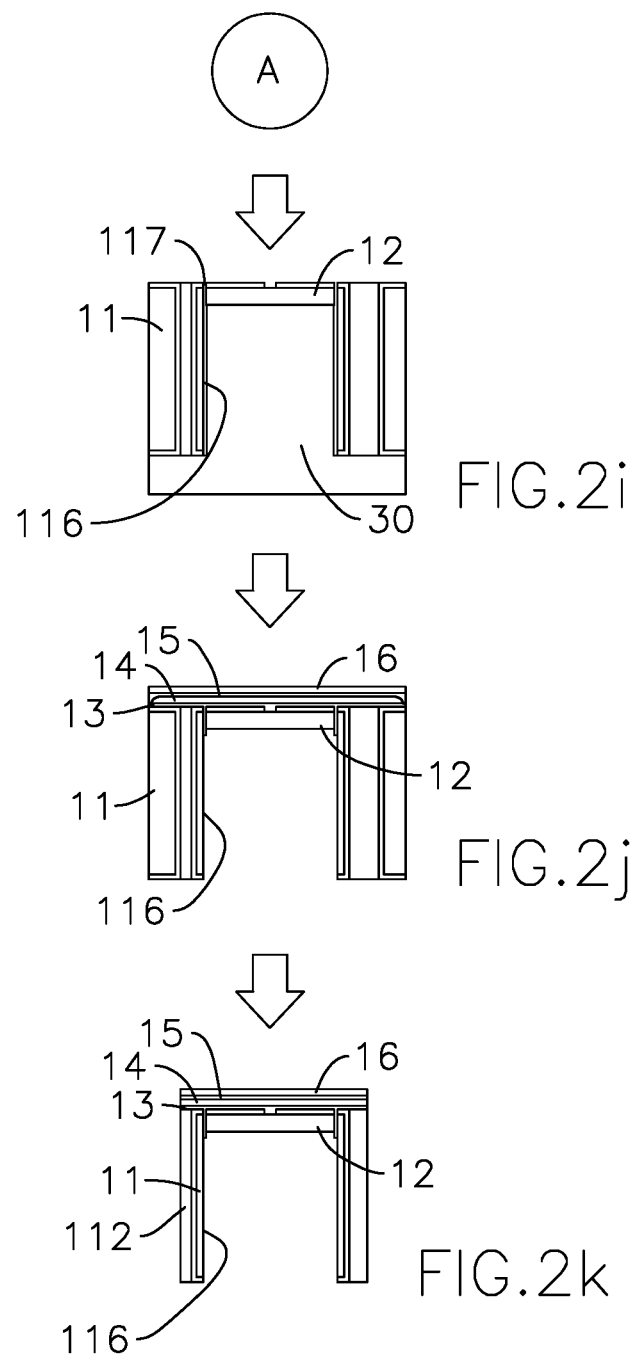

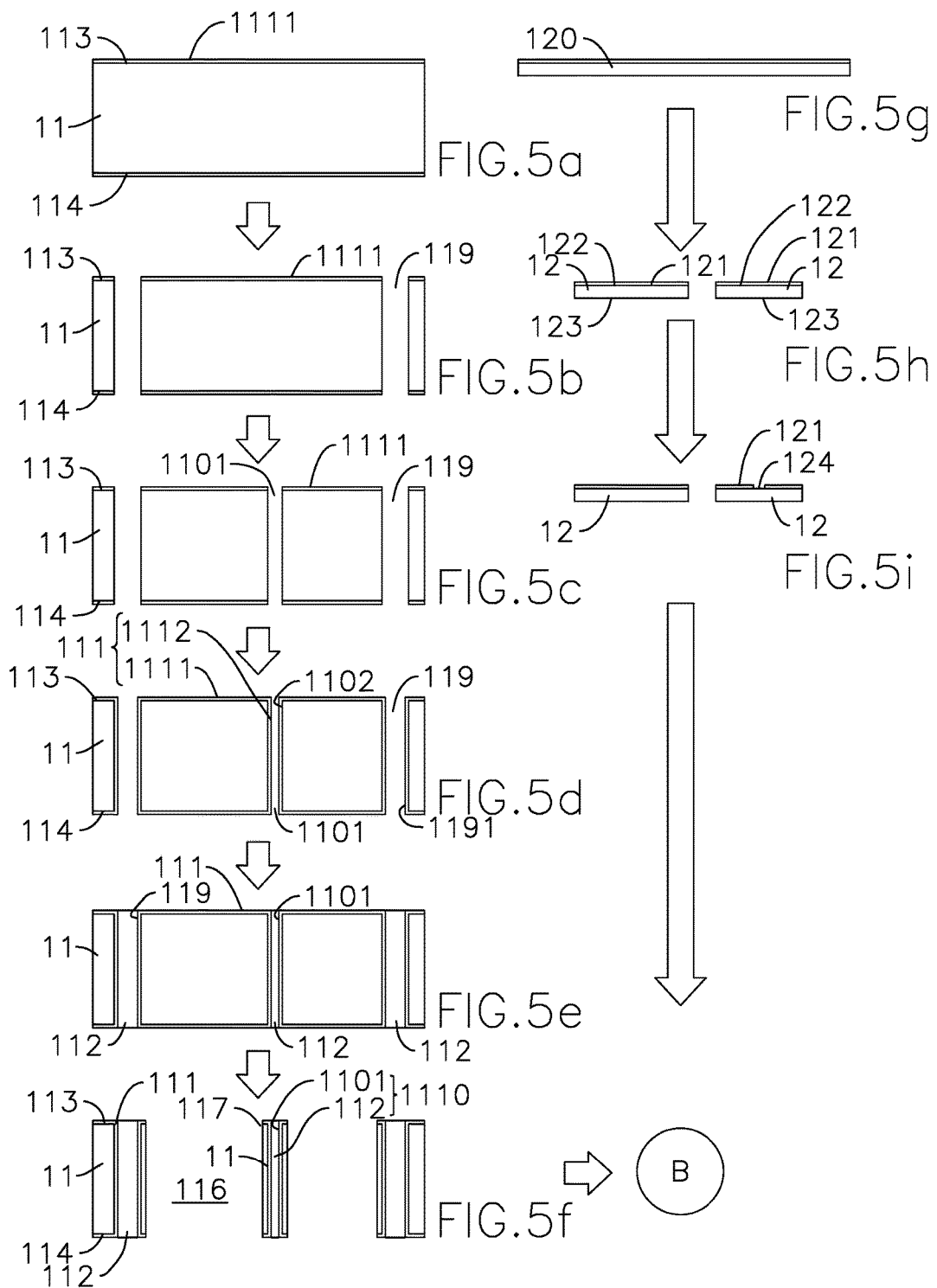

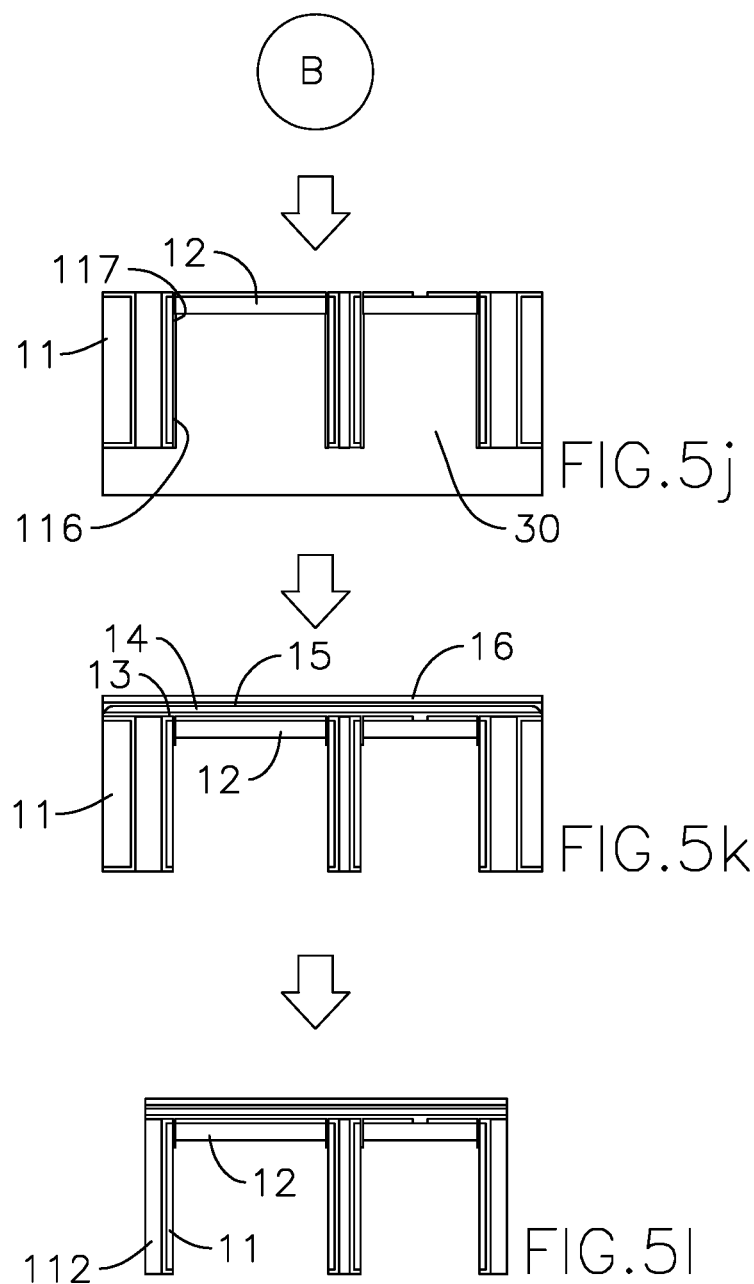

ELECTROMAGNETIC-INTERFERENCE SHIELDING DEVICE AND METHOD FOR MANUFACTURING THE SAME

CROSS-REFERENCES TO RELATED APPLICATIONS

This application is a continuation application of U.S. application Ser. No. 15/488,133 filed in United States on Apr. 14, 2017, the entire contents of which are hereby incorporated by reference.

BACKGROUND OF THE INVENTION

1. Field of the Invention

The present invention relates to a shielding device, and particularly to an electromagnetic-interference shielding device and a method for manufacturing an electromagnetic-interference shielding device.

2. Description of the Related Art

A plurality of electronic elements may be mounted on a printed circuit board (PCB). When the electronic elements are operated, some of the electronic elements may produce electromagnetic radiation to affect other electronic elements. Meanwhile, the electronic elements may be also affected by environmental electromagnetic radiation. Therefore, a shielding device is provided to shield the electromagnetic radiation. With reference to FIGS. 6, 7 and 8, a shielding device 40 is mounted on a PCB 50 to shield electronic elements (not shown in figures) mounted on the PCB 50 from electromagnetic interference (EMI). The shielding device 40 may further shield the electromagnetic radiation produced by the electronic elements mounted on the PCB 50 to avoid generating EMI.

Normally, a plurality of clamping elements 51 are mounted on the PCB 50, and the shielding device 40 is clamped by the clamping elements 51 to be mounted on the PCB 50. Further, the shielding device 40 may be electrically connected to a ground circuit of the PCB 50 through the clamping elements 51 to be grounded to shield the electromagnetic radiation.

Since the shielding device 40 is manufactured by molding and each kind of the shielding device 40 has a different shape, a plurality of molds may be developed for many kinds of the shielding devices 40. Each mold may have its molding cost. Therefore, the more an amount of the molds, the higher the cost of the shielding device 40. Then, cost of the PCB 50 may be also increased. Further, the PCB 50 has the clamping elements 51, and the clamping elements 51 may increase the cost of the PCB 50. Therefore, the increased cost of the PCB 50 may be a heavy burden for a manufacturer of the PCB 50.

Besides, since the shielding device 40 is clamped to be mounted on the PCB 50 through the clamping elements 51, a narrow gap may be formed between the shielding device 40 and a surface of the PCB 50. The electromagnetic radiation may leak through the narrow gap. Then, the shielding device 40 may not effectively shield the electronic elements from the EMI. Further, since the shielding device 40 is clamped to be mounted on the PCB 50, the shielding device 40 may not be firmly mounted on the PCB. When the PCB 50 is shaken, the shielding device 40 may slide out of the PCB 50. Therefore, the conventional shielding device 40 needs to be improved.

SUMMARY OF THE INVENTION

An objective of the present invention is to provide an electromagnetic-interference shielding device (EMI shielding device) and a method for manufacturing an electromagnetic-interference shielding device. The EMI shielding device may lower cost of a PCB having the EMI shielding device, and may be firmly mounted on the PCB.

To achieve the foregoing objective, the EMI shielding device comprises a first substrate, at least one second substrate, and a conductive paste.

The first substrate comprises a first surface, a second surface, an exterior surface, a first shielding layer, and at least one through hole; the first surface and the second surface are opposite to each other; the exterior surface is located on an edge of the first surface and an edge of the second surface, and being perpendicular to the first surface and the second surface; the first shielding layer covers the first surface, the second surface, and the exterior surface of the first substrate; and the at least one through hole is formed through the first substrate, and each through hole comprising a first opening formed on the first surface of the first surface and a second opening formed on the second surface of the first substrate. The at least one second substrate is mounted in the first opening of the at least one through hole of the first substrate, and each second substrate comprises a first surface, a second surface, and a second shielding layer; the first surface and the second a surface are opposite to each other; and the second shielding layer is mounted on the first surface of the at least one second substrate. The conductive paste is mounted between the first substrate and the at least one second substrate, and covering the first shielding layer of the first substrate and the second shielding layer of the at least one second substrate to electrically connect the first shielding layer and the second shielding layer.

In one embodiment, the first substrate further comprises an ink layer covering the first shielding layer along the exterior surface.

In one embodiment, the electromagnetic-interference shielding device further comprises a shield layer mounted on a surface of the conductive paste.

In one embodiment, the electromagnetic-interference shielding device further comprises an antirust layer mounted on a surface of the shielding layer.

In one embodiment, the electromagnetic-interference shielding device further comprising a protective layer mounted on a surface of the antirust layer.

In one embodiment, the antirust layer is made of nickel.

In one embodiment, the first shielding layer of the first substrate and the second shielding layer of the at least one second substrate are made of copper.

In one embodiment, a positioning point is formed on the second shielding layer of the second substrate.

In one embodiment, the at least one second substrate comprises a plurality of second substrates; the at least one through hole of the first substrate comprises a plurality of through holes; a portion of the first substrate is located between two adjoining ones of the through holes to form a shielding part; the shielding part comprises a via hole; the first shielding layer of the first substrate is further formed on an inner wall of the via hole; and the via hole is filled with an ink layer.

To achieve the foregoing objective, the method for manufacturing an electromagnetic-interference shielding device comprises: providing a first substrate having a first surface, a second surface opposite to the first surface, and a first shielding layer formed on the first surface and the second surface; forming a plurality of second through holes on the first substrate; forming the first shielding layer on an inner wall of each of the second through holes; forming at least a first through hole on the first substrate; wherein the at least one first through hole comprises a first opening formed on the first surface and a second opening formed on the second surface; providing at least on second substrate having a first surface, a second surface opposite to the first surface, and a second shielding layer formed on the first surface of the second substrate; mounting the first substrate on a mounting base, and locating the second substrate in the first opening of the at least through hole of the first substrate; and mounting a conductive paste between the first substrate and the second substrate to cover the first shielding layer of the first substrate and the second shielding layer of the at least one second substrate, and removing the mounting base.

In one embodiment, the method further comprises mounting a shielding layer on a surface of the conductive paste.

In one embodiment, the method further comprises mounting an antirust layer on a surface of the shielding layer and a protective layer on a surface of the antirust layer.

In one embodiment, the antirust layer is made of nickel.

In one embodiment, the first shielding layer of the first substrate and the second shielding layer of the at least one second substrate are made of copper.

In one embodiment, the method further comprises forming two first seed layers respectively covering the first surface and the second surface of the first substrate before forming a plurality of second through holes on the first substrate.

In one embodiment, the method further comprises forming the first shielding layer comprises forming a second seed layer formed on inner walls of the second through holes and connected to the first seed layers on the first surface and the second surface to form the first shielding layer by the first seed layer and the second seed layer.

In one embodiment, an ink layer is filled within the second through holes and the first substrate is cut to expose the ink layer of the first substrate 11 after removing the base.

In one embodiment, the at least one first through hole is formed t among the plurality of second through holes.

In one embodiment, a positioning point is formed on the second shielding layer of the second substrate.

In one embodiment, the at least one second substrate comprises a plurality of second substrates; the at least one through hole of the first substrate comprises a plurality of through holes; a portion of the first substrate is located between two adjoining ones of the through holes to form a shielding part; the shielding part comprises a via hole; the first shielding layer of the first substrate is further formed on an inner wall of the via hole; and the via hole is filled with an ink layer.

When the EMI shielding device is mounted on a PCB, the second surface of the first substrate of the EMI shielding device faces to the PCB to mount the EMI shielding device on the PCB. Since the first shielding layer covers the second surface and the first shielding layer is made of metal, the EMI shielding device may be mounted on bounding pads of the PCB by surface mount technology (SMT). Electronic elements mounted on the PCB may be contained in the at least one through hole of the first substrate, and then the EMI shielding device may prevent the electronic elements from the EMI.

Since the EMI shielding device is mounted on the PCB by the SMT, the EMI shielding device may be firmly mounted on the PCB. Further, the EMI shielding device is directly welded on a surface of the PCB, and therefore there is no narrow gap that may leak the electromagnetic radiation. The EMI shielding device may effectively prevent the electronic elements from the EMI. Besides, since the EMI shielding device is not manufactured by molding and clamping elements may not be mounted on the PCB, cost of the PCB may be decreased.

Other objectives, advantages and novel features of the invention will become more apparent from the following detailed description when taken in conjunction with the accompanying drawings.

BRIEF DESCRIPTION OF THE DRAWINGS

FIGS. 2a-2k are schematic views showing manufacturing flow of the first embodiment of the EMI shielding device of FIG. 1;

FIGS. 5a-5l are schematic views showing manufacturing flows of the second embodiment of the EMI shielding device of FIG. 3;

DETAILED DESCRIPTION OF THE INVENTION

Figure 1:
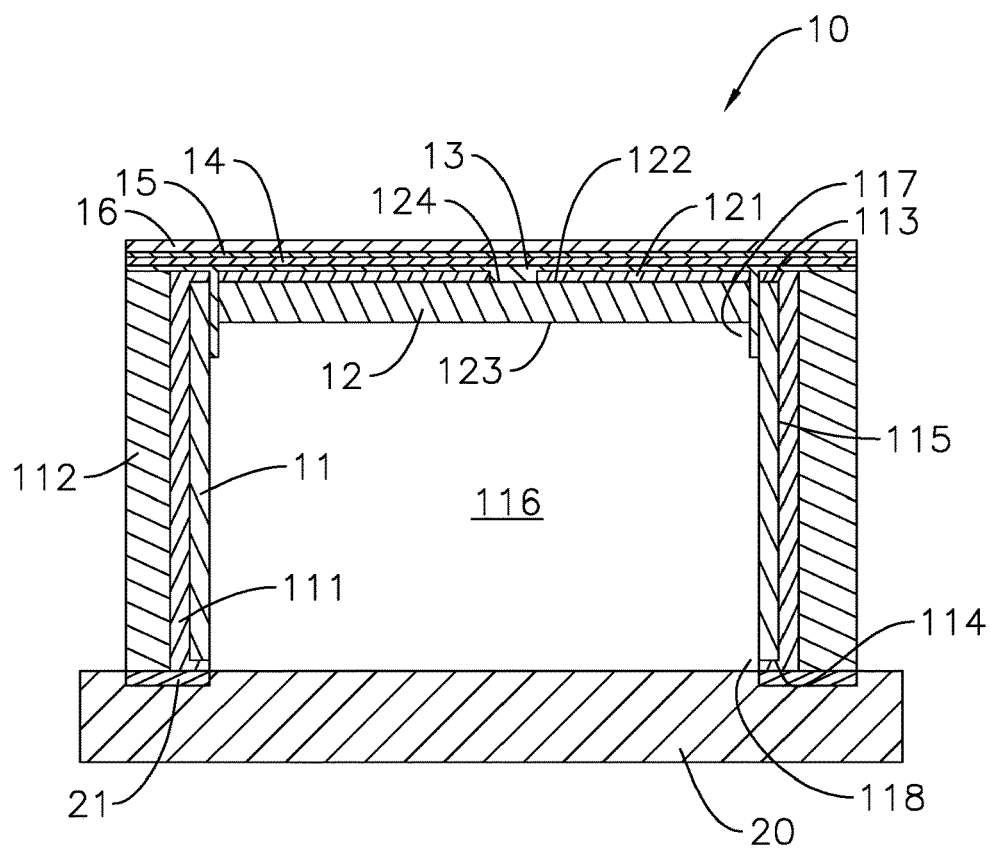
FIG. 1 is a cross sectional view of a first embodiment of an EMI shielding device of the present invention.

With reference to FIG. 1, the present invention is an electromagnetic-interference (hereinafter referred to as EMI) shielding device 10. A first embodiment of the EMI shielding device 10 comprises a first substrate 11, at least one second substrate 12, a conductive paste 13, a shielding layer 14, an antirust layer 15, and a protective layer 16.

The first substrate 11 comprises a first shielding layer 111, an ink layer 112, a first surface 113, a second surface 114, and an exterior surface 115. The first surface 113 is opposite the second surface 114. The exterior surface 115 is located on an edge of the first surface 113 and an edge of the second surface 114, and the exterior surface 115 is perpendicular to the first surface 113 and the second surface 114.

The first shielding layer 111 covers the first surface 113, the second surface 114, and the exterior surface 115 of the first substrate 11. The ink layer 112 covers the first shielding layer 111 along the exterior surface 115. At least one through hole (hereinafter referred to as first through hole 116) is formed through the first substrate 11, and the at least one first through hole 116 comprises a first opening 117 and a second opening 118. The first opening 117 of the at least one first through hole 116 is formed on the first surface 113 of the first substrate 11, and the second opening 118 of the at least one first through hole 116 is formed on the second surface 114 of the first substrate 11.

The at least one second substrate 12 is mounted in the first opening 117 of the at least one first through hole 116 of the first substrate 11, and the at least one second substrate 12 comprises a second shielding layer 121, a first surface 122, and a second surface 123. The first surface 122 of the at least one second substrate 12 is opposite the second surface 123 of the at least one second substrate 12. The second shielding layer 121 is mounted on the first surface 122 of the at least one second substrate 12.

The conductive paste 13 is mounted between the first substrate 11 and the at least one substrate 12, and covers the first shielding layer 111 of the first substrate 11 and the second shielding layer 121 of the at least one second substrate 12 to electrically connect the first shielding layer 111 and the second shielding layer 121.

The shielding layer 14 is mounted on a surface of the conductive paste 13. The antirust layer 15 is mounted on a surface of the shielding layer 14. The protective layer 16 is mounted on a surface of the antirust layer 15.

With reference to FIGS. 2a-2k, a manufacturing flow of the first embodiment of the EMI shielding device is shown.

As shown in FIG. 2a, a first substrate 11 is provided. The first substrate 11 comprises a first surface 113, a second surface 114, and two first seed layers 1111. The two first seed layers 1111 respectively cover the first surface 113 and the second surface 114 of the first substrate 11. The first surface 113 of the first substrate 11 is opposite the second surface 114 of the first substrate 11.

As shown in FIG. 2b, a plurality of through holes (hereinafter referred to as second through holes 119) are formed on the first substrate 11 and formed through the first seed layer 1111.

As shown in FIG. 2c, a second seed layer 1112 is formed on inner walls of the second through holes 119 and connected to the first seed layer 1111 on the first surface 113 and the second surface 114. A first shielding layer 111 is formed by the first seed layer 1111 and the second seed layer 1112.

As shown in FIG. 2d, the second through holes 119 are filled with an ink layer 112.

As shown in FIG. 2e, at least one first through hole 116 is formed through the first substrate 11 and the first seed layer 1111 and among the plurality of second through holes 119. The at least one first through hole 116 comprises a first opening 117 and a second opening 118. The first opening 117 of the at least one first through hole 116 is formed on the first surface 113 of the first substrate 11, and the second opening 118 of the at least one first through hole 116 is formed on the second surface 114 of the first substrate 11.

As shown in FIG. 2f, at least one second substrate 12 is provided. The at least one second substrate 12 comprises a first surface 122 and a second surface 123, and a second shielding layer 121 covers the first surface 122 of the at least one second substrate 12. The first surface 122 of the at least one second substrate 12 is opposite the second surface 123 of the at least one second substrate 12.

As shown in FIG. 2g, the at least one second substrate 12 is cut.

As shown in FIG. 2h, a positioning point 124 is formed on the second shielding layer 121. In an embodiment, the positioning point 124 may be formed by exposure and development.

As shown in FIG. 2i, the first substrate 11 and the at least one second substrate 12 are mounted on a mounting base 30. The at least one second substrate 12 is located in the first opening 117 of the at least one first through hole 116 of the first substrate 11.

As shown in FIG. 2j, the conductive paste 13 is mounted between the first substrate 11 and the at least one second substrate 12, and covers the first shielding layer 111 and the second shielding layer 121. The shielding layer 14 is mounted on a surface of the conductive paste 13, the antirust layer 15 is mounted on a surface of the shielding layer 14, and the protective layer 16 is mounted on a surface of the antirust layer 15. When the first substrate 11 and the at least one second substrate 12 are connected by the conductive paste 13, the mounting base 30 may be removed.

As shown in FIG. 2k, the first substrate 11 is cut to expose the ink layer 112 of the first substrate 11.

With reference to FIG. 1, the second surface 114 of the first substrate 11 faces to a printed circuit board (PCB) 20 to mount the EMI shielding device 10 on the PCB 20. Since the first shielding layer 111 is made of metal, the first shielding layer 111 on the second surface 114 of the first substrate 11 may be welded on bounding pads 21 of the PCB 20, and the EMI shielding device 10 may be mounted on the PCB 20 by SMT. Then, the EMI shielding device 10 may be firmly mounted on the PCB 20.

Since electronic elements (not shown in figures) mounted on the PCB 20 may be contained in the at least one first through hole 116 of the first substrate 11, the EMI shielding device 10 may shield the electronic elements from the EMI.

Further, the EMI shielding device 10 is directly welded on a surface of the PCB 20, and therefore there is no narrow gap that may leak the electromagnetic radiation. The EMI shielding device 10 may effectively shield the electronic elements of the PCB 20 from the EMI. Besides, since the EMI shielding device 10 is not manufactured by molding and clamping elements need not be mounted on the PCB 20, cost of the PCB 20 may be decreased.

Further, since the at least one second substrate 12 comprises the positioning point 124, a pick-and-place machine may pick the at least one second substrate 12 through the positioning point 124, and may precisely place the at least one second substrate 12 into the first opening 117 of the at least one first through hole 116 of the first substrate 11. Therefore, precision of the EMI shielding device 10 may be raised.

In the first embodiment, the second through holes 119 of the first substrate 11 are formed by machine drilling. The antirust layer 15 is made of nickel. The first shielding layer 111 of the first substrate 11 and the second shielding layer 121 of the at least one second substrate 12 are made of copper.

Figure 3:
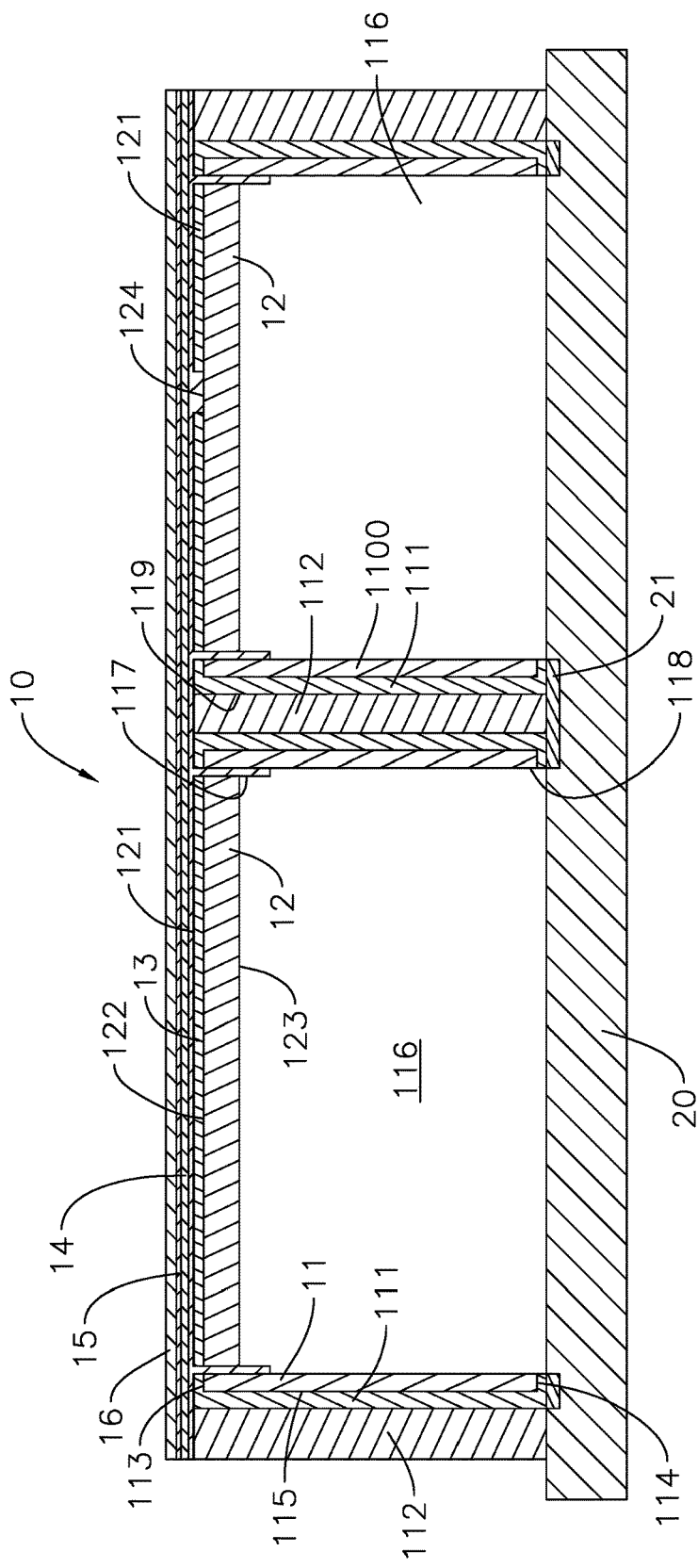
FIG. 3 is a cross sectional view of a second embodiment of an EMI shielding device of the present invention.
Figure 4:
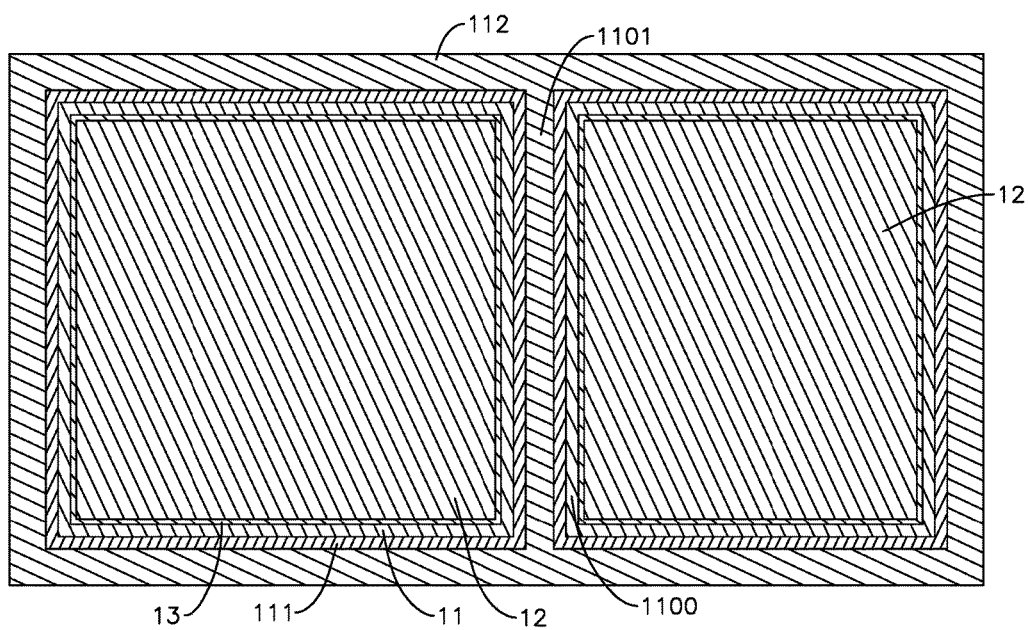
FIG. 4 is another cross sectional view of the second embodiment of the EMI shielding device of FIG. 3.
Figure 6:
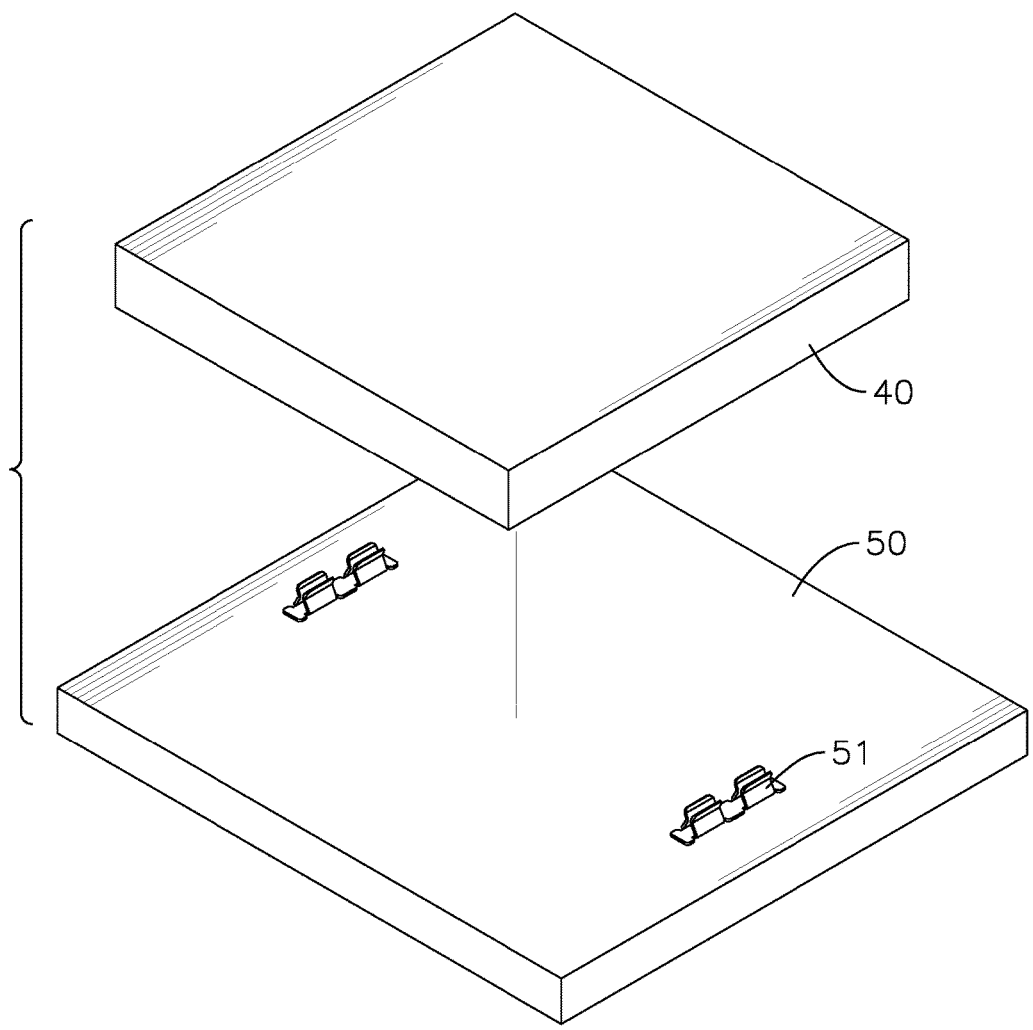
FIGS. 6 and 7 are schematic views showing a conventional shielding device mounted on a PCB.
Figure 7:
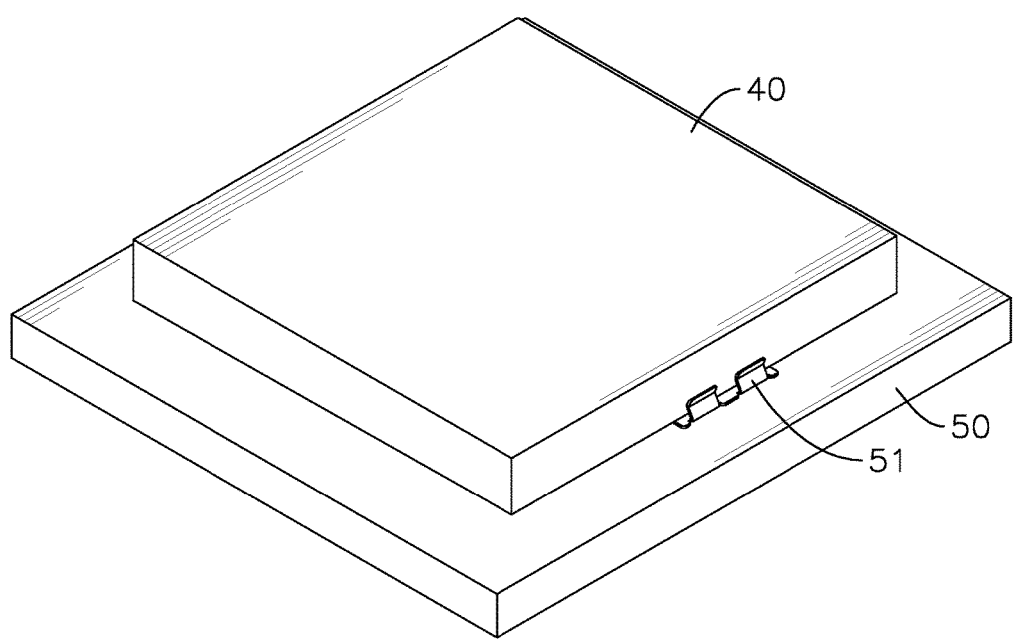
Figure 8:
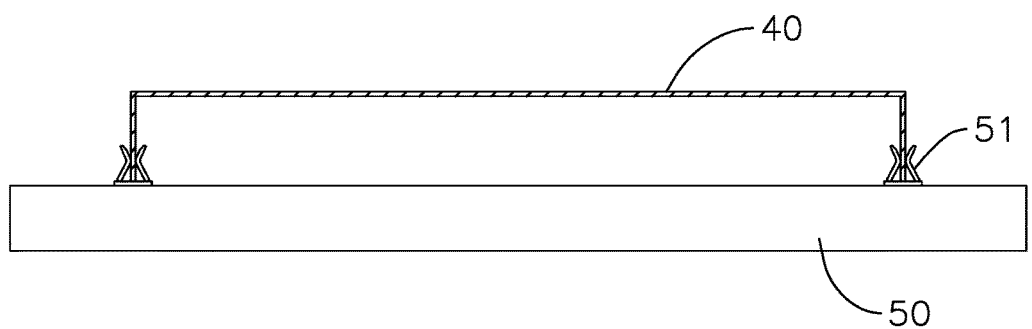
FIG. 8 is a cross sectional view of the conventional shielding device mounted on the PCB of FIG. 7.

With reference to FIGS. 3 and 4, a second embodiment of the EMI shielding device 10 is shown. In the second embodiment, the EMI shielding device 10 comprises a plurality of second substrates 12, and the first substrate 11 comprises a plurality of first through holes 116. A portion of the first substrate 11 located between two adjoining first through holes 116 forms a shielding part 1100. The shielding part 1100 comprises a via hole 1101. The first shielding layer 111 of the first substrate 11 is further formed on an inner wall of the via hole 1101, and the via hole 1101 is filled with the ink layer 112.

With reference to FIGS. 5a-5l, a manufacturing flow of the second embodiment of the EMI shielding device is shown.

As shown in FIG. 5a, a first substrate 11 is provided. The first substrate 11 comprises a first surface 113 and the second surface 114, and a first seed layer 1111 covers the first surface 113 and the second surface 114 of the first substrate 11. The first surface 113 of the first substrate 11 is opposite the second surface 114 of the first substrate 11.

As shown in FIG. 5b, a plurality of second through holes 119 are formed on the first substrate 11.

As shown in FIG. 5c, at least one via hole 1101 is formed on the first substrate 11, wherein the via hole 1101 is formed through the first surface 113, the second surface 114, and the first seed layer 1111.

As shown in FIG. 5d, a second seed layer 1112 is formed on inner walls of the second through holes 119 and an inner wall of the at least one via hole 1101. A first shielding layer 111 consists of the first seed layer 1111 and the second seed layer 1112.

As shown in FIG. 5e, the second through holes 119 and the at least one via hole 1101 are filled with an ink layer 112.

As shown in FIG. 5f, at least one first through hole 116 is formed on the first substrate 11. The at least one first through hole 116 comprises a first opening 117 and a second opening 118. The first opening 117 of the at least one first through hole 116 is formed on the first surface 113 of the first substrate 11, and the second opening 118 of the at least one first through hole 116 is formed on the second surface 114 of the first substrate 11. A portion of the first substrate 11 located between two adjoining first through holes 116 forms a shielding part 1100. The shielding part 1100 comprises the via hole 1101.

As shown in FIG. 5g, a mother board 120 is provided.

As shown in FIG. 5h, the mother board 120 is cut to form a plurality of second substrates 12. The second substrates 12 each respectively comprise a first surface 122 and a second surface 123, and a second shielding layer 121 covers the first surface 122 of one of the second substrates 12. The first surface 122 is opposite the second surface 123 of one of the second substrates 12.

As shown in FIG. 5i, the second shielding layers 121 of the second substrates 12 are exposed and developed to form positioning points 124.

As shown in FIG. 5j, the first substrate 11 and the second substrates 12 are mounted on a mounting base 30. The second substrates 12 are respectively mounted in the first openings 117 of the first through holes 116 of the first substrate 11.

As shown in FIG. 5k, the conductive paste 13 is mounted between the first substrate 11 and the second substrates 12, and covers the first shielding layer 111 of the first substrate 11 and the second shielding layers 121 of the second substrates 12. When the first substrate 11 and the second substrates 12 are connected through the conductive paste 13, the mounting base 30 may be removed. The shielding layer 14 is mounted on a surface of the conductive paste 13, the antirust layer 15 is mounted on a surface of the shielding layer 14, and the protective layer 16 is mounted on a surface of the antirust layer 15.

As shown in FIG. 5l, the first substrate 11 is cut to expose the ink layer 112 of the first substrate 11.

With reference to FIG. 3, when the EMI shielding device 10 is mounted on the PCB 20, the electronic elements of the PCB 20 may be respectively contained in the first through holes 116, and then the EMI shielding device 10 may respectively shield the electronic elements from the EMI.

In the second embodiment, the via hole 1101 of the first substrate 11 is formed by laser drilling.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A method for manufacturing an electromagnetic-interference shielding device, comprising:
    providing a first substrate having a first surface, a second surface opposite to the first surface, and a first shielding layer formed on the first surface and the second surface;
    forming a plurality of second through holes on the first substrate;
    forming the first shielding layer on an inner wall of each of the second through holes;
    forming at least a first through hole on the first substrate; wherein the at least one first through hole comprises a first opening formed on the first surface and a second opening formed on the second surface;
    providing at least on second substrate having a first surface, a second surface opposite to the first surface, and a second shielding layer formed on the first surface of the second substrate;
    mounting the first substrate on a mounting base, and locating the second substrate in the first opening of the at least through hole of the first substrate; and
    mounting a conductive paste between the first substrate and the second substrate to cover the first shielding layer of the first substrate and the second shielding layer of the at least one second substrate, and removing the mounting base.

2. The method as claimed in claim 1, further comprising mounting a shielding layer on a surface of the conductive paste.

3. The method as claimed in claim 2, further comprising mounting an antirust layer on a surface of the shielding layer and a protective layer on a surface of the antirust layer.

4. The method as claimed in claim 3, wherein the antirust layer is made of nickel.

5. The method as claimed in claim 1, wherein the first shielding layer of the first substrate and the second shielding layer of the at least one second substrate are made of copper.

6. The method as claimed in claim 1, further comprising forming two first seed layers respectively covering the first surface and the second surface of the first substrate before forming a plurality of second through holes on the first substrate.

7. The method as claimed in claim 6, wherein the forming the first shielding layer comprises forming a second seed layer formed on inner walls of the second through holes and connected to the first seed layers on the first surface and the second surface to form the first shielding layer by the first seed layer and the second seed layer.

8. The method as claimed in claim 7, wherein an ink layer is filled within the second through holes and the first substrate is cut to expose the ink layer of the first substrate 11 after removing the base.

9. The method as claimed in claim 8, wherein the at least one first through hole is formed t among the plurality of second through holes.

10. The method as claimed in claim 1, wherein a positioning point is formed on the second shielding layer of the second substrate.

11. The method as claimed in claim 1, wherein:
    the at least one second substrate comprises a plurality of second substrates;
    the at least one through hole of the first substrate comprises a plurality of through holes;
    a portion of the first substrate is located between two adjoining ones of the through holes to form a shielding part;
    the shielding part comprises a via hole;
    the first shielding layer of the first substrate is further formed on an inner wall of the via hole; and
    the via hole is filled with an ink layer.

* * * * *